US010973144B2

(12) United States Patent
Lee et al.

(10) Patent No.: US 10,973,144 B2
(45) Date of Patent: Apr. 6, 2021

(54) ELECTRONIC DEVICE

(71) Applicants: Kuan-Chang Lee, Taipei (TW);
Ming-Chung Liu, Taipei (TW);
Wei-Ting Chen, Taipei (TW);
Tung-Ying Wu, Taipei (TW)

(72) Inventors: Kuan-Chang Lee, Taipei (TW);
Ming-Chung Liu, Taipei (TW);
Wei-Ting Chen, Taipei (TW);
Tung-Ying Wu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/986,832

(22) Filed: May 23, 2018

(65) Prior Publication Data

US 2018/0343760 A1 Nov. 29, 2018

Related U.S. Application Data

(60) Provisional application No. 62/509,749, filed on May 23, 2017.

(51) Int. Cl.
*H05K 7/14* (2006.01)
*G06F 1/16* (2006.01)
*G06F 3/02* (2006.01)

(52) U.S. Cl.
CPC ............ *H05K 7/14* (2013.01); *G06F 1/1626* (2013.01); *G06F 1/1632* (2013.01);
(Continued)

(58) Field of Classification Search
CPC ........ G06F 3/0202; G06F 1/16; G06F 1/1662; G06F 1/1622; G06F 1/1624;
(Continued)

(56) References Cited

U.S. PATENT DOCUMENTS 6,028,768 A * 2/2000 Cipolla ................ G06F 1/1616
361/679.12
6,094,341 A * 7/2000 Lin ....................... G06F 1/1616
345/905
(Continued)

FOREIGN PATENT DOCUMENTS

CN 1921509 2/2007
CN 101142539 3/2008
(Continued)

OTHER PUBLICATIONS

"Office Action of Taiwan Counterpart Application," dated Sep. 3, 2018, pp. 1-5.

(Continued)

*Primary Examiner* — Hung S. Bui
*Assistant Examiner* — Sagar Shrestha
(74) *Attorney, Agent, or Firm* — JCIPRNET

(57) ABSTRACT

Provided is an electronic device, including a main body, a first functional module, a linkage mechanism, and a second functional module. The first functional module is slidably provided on the main body between a first position and a second position. The linkage mechanism is provided on the main body and is connected to the first functional module. The second functional module is linked to the linkage mechanism and is provided on the main body in a turnover manner, in which when the first functional module is located at the first position, the second functional module is covered by the first functional module, and when the first functional module moves to the second position and the second functional module is exposed, the second functional module is driven by the linkage mechanism to be turned up.

12 Claims, 10 Drawing Sheets

(52) U.S. Cl.
CPC .......... *G06F 1/1654* (2013.01); *G06F 1/1669* (2013.01); *G06F 3/0202* (2013.01); *G06F 3/0221* (2013.01); *G06F 3/0227* (2013.01)

(58) Field of Classification Search
CPC .... G06F 1/1667; G06F 1/1626; G06F 1/1632; G06F 1/1654; G06F 1/1669; G06F 3/0221; G06F 3/0227; G06F 1/1684; G06F 1/1658; G06F 1/1616; G06F 1/1618; G06F 1/1681; H05K 7/14
See application file for complete search history.

(56) References Cited

U.S. PATENT DOCUMENTS

| | | | | |
|---|---|---|---|---|
| 6,755,581 | B1* | 6/2004 | Huang | G06F 3/0221 400/472 |
| 7,330,548 | B2* | 2/2008 | Kim | H04M 1/0247 379/433.11 |
| 8,385,992 | B2* | 2/2013 | Davidson | G06F 1/1624 361/629 |
| 10,550,995 | B1* | 2/2020 | Hung | H04M 1/0227 |
| 2003/0073414 | A1* | 4/2003 | P. Capps | H04M 1/23 455/90.1 |
| 2003/0103041 | A1* | 6/2003 | Nguyen | G06F 1/1624 345/168 |
| 2004/0027335 | A1* | 2/2004 | Lin | H04M 1/23 345/168 |
| 2006/0018088 | A1* | 1/2006 | Gitzinger | G06F 1/1616 361/679.27 |
| 2006/0274492 | A1* | 12/2006 | Roh | G06F 1/1616 361/679.09 |
| 2010/0027224 | A1* | 2/2010 | Wang | H04M 1/0237 361/728 |
| 2010/0105429 | A1* | 4/2010 | Koitabashi | G06F 1/1616 455/556.1 |
| 2011/0122555 | A1* | 5/2011 | Yeh | G06F 1/1624 361/679.01 |
| 2011/0134595 | A1* | 6/2011 | Wei | H04M 1/0237 361/679.09 |
| 2011/0188187 | A1* | 8/2011 | Barnett | G06F 1/1666 361/679.01 |
| 2012/0162879 | A1* | 6/2012 | Totsuka | G06F 1/1681 361/679.01 |
| 2013/0058048 | A1* | 3/2013 | Choi | G06F 1/1681 361/727 |
| 2013/0203473 | A1* | 8/2013 | Kota | H04M 1/23 455/575.8 |
| 2015/0370286 | A1* | 12/2015 | Zhang | G06F 1/1643 361/679.27 |

FOREIGN PATENT DOCUMENTS

| | | |
|---|---|---|
| CN | 101647259 | 2/2010 |
| CN | 101453851 | 7/2011 |
| TW | 201345384 | 11/2013 |
| TW | I453572 | 9/2014 |

OTHER PUBLICATIONS

"Office Action of China Counterpart Application", dated Dec. 31, 2019, pp. 1-6.

* cited by examiner

ELECTRONIC DEVICE

CROSS-REFERENCE TO RELATED APPLICATION

This application claims the priority benefit of U.S. provisional application Ser. No. 62/509,749, filed on May 23, 2017. The entirety of the above-mentioned patent application is hereby incorporated by reference herein and made a part of this specification.

BACKGROUND OF THE INVENTION

1. Field of the Invention

The present invention relates to an electronic device, and in particular to an electronic device having two functional modules movably provided thereon.

2. Description of Related Art

With the technical progress, demands of consumers for multifunctional electronic devices are increasingly diverse. For example, consumers may use notebooks to perform general word processing and play online games. However, when performing word processing, consumers have slight demands for screen sizes, but if they want to play online games, screen sizes may not meet demands since a great amount of information needs to be output. In addition, electronic devices also have other expansion demands besides screens. How to expand the functions of electronic devices under limited body sizes is a research objective of this field.

SUMMARY OF THE INVENTION

The present invention provides an electronic device, which has a plurality of functional modules movably provided, so as to provide expanded functions on the premise of keeping a certain overall size.

An electronic device in the present invention includes a main body, a first functional module, a linkage mechanism, and a second functional module. The first functional module is slidably provided on the main body between a first position and a second position. The linkage mechanism is provided on the main body and is connected to the first functional module. The second functional module is linked to the linkage mechanism and is provided on the main body in a turnover manner, wherein when the first functional module is located at the first position, the second functional module is covered by the first functional module, and when the first functional module moves to the second position and the second functional module is exposed, the second functional module is driven by the linkage mechanism to be turned up.

In an embodiment of the present invention, the linkage mechanism includes a gear provided on the main body, a first rack engaged with the gear and movably provided on the main body, a support member pivoted to the first rack and located below the second functional module, an abutting member fixed to the main body and abutted by the support member, and a second rack provided on the first functional module and suitable for being engaged with the gear. When the first functional module moves from the first position to the second position, the second rack drives the gear to rotate, and the first rack correspondingly moves to enable the support member to gradually stand on the main body along the abutting member so as to support the second functional module.

In an embodiment of the present invention, when the first functional module moves from the first position to the second position, the end, pivoted to the first rack, of the support member gradually approaches the abutting member to make the support member gradually stand.

In an embodiment of the present invention, the linkage mechanism includes a rod body rotatably provided in the main body, a push block linked to the first functional module, and a support member provided on the main body in a turn-up manner and located below the second functional module, the rod body has a first end and a second end opposite to the first end, when the first functional module moves from the first position to the second position, the push block pushes the first end of the rod body to make the rod body rotate, and the second end of the rod body presses a part of the support member to correspondingly lift the other part of the support member to drive the second functional module to be turned up.

In an embodiment of the present invention, the push block and the support member are located on the same side of the rod body, the first end includes a protrusion located on a movement path of the push block, the support member includes an inclined surface facing the second end, and the inclined surface is a part, pressed by the second end of the rod body, of the support member.

In an embodiment of the present invention, the electronic device further includes a movement member, the main body includes a track, and the movement member is fixed to the first functional module and is movably provided on the track.

In an embodiment of the present invention, the electronic device further includes a stop structure, provided on the main body, wherein when the first functional module moves to the second position, the movement member is limited by the stop structure to make the first functional module stay at the second position.

In an embodiment of the present invention, the stop structure includes a cantilever, the cantilever is pivoted to the main body, a first end of the cantilever has a positioning notch, the movement member has a positioning protrusion corresponding to the positioning notch, and when the first functional module is located at the second position, the positioning protrusion is located in the positioning notch.

In an embodiment of the present invention, the electronic device further includes an auxiliary body, pivoted to the main body and suitable for being folded toward the main body or unfolded relative to the main body, the auxiliary body includes a push member, and a second end of the cantilever is located on a motion path of the push member, wherein when the first functional module is located at the second position, in a process from a position where the auxiliary body is unfolded relative to the main body to a position where the auxiliary body is folded, the push member pushes the second end of the cantilever, and the cantilever correspondingly rotates to make the positioning notch of the cantilever not restrict the positioning protrusion of the movement member.

In an embodiment of the present invention, when the push member pushes the second end of the cantilever, the motion direction of the push member is different from the motion direction of the second end of the cantilever, and at least one of the push member and the second end of the cantilever includes an inclined surface or a cambered surface.

In an embodiment of the present invention, the electronic device further includes an elastic member, provided between the movement member and the stop structure and suitable for making the first functional module return to the first position.

In an embodiment of the present invention, the first functional module includes a keyboard module, and the second functional module includes at least one of a screen, a loudspeaker, a camera lens, and a receiver.

In an embodiment of the present invention, the main body includes a processor, the first functional module and the second functional module are electrically connected to the processor, respectively, and when the first functional module moves to the second position, the processor starts up the second functional module.

Based on the foregoing, according to the electronic device in the present invention, the first functional module and the second functional module are movably provided on the main body via the linkage mechanism, and the second functional module may be turned over along with the movement of the first functional module. When the first functional module is located at the first position, the second functional module is covered by the first functional module, and the overlapped first and second functional modules may keep a small size of the electronic device. When the first functional module moves to the second position and the second functional module is exposed, the second functional module is driven by the linkage mechanism to be turned up, so that the electronic device can be conveniently used by a user, and expanded functions of the electronic device can be provided.

In order to make the aforementioned and other characteristics and advantages of the present invention comprehensible, embodiments accompanied with drawings are described in detail below.

DESCRIPTION OF THE EMBODIMENTS

Figure 1:
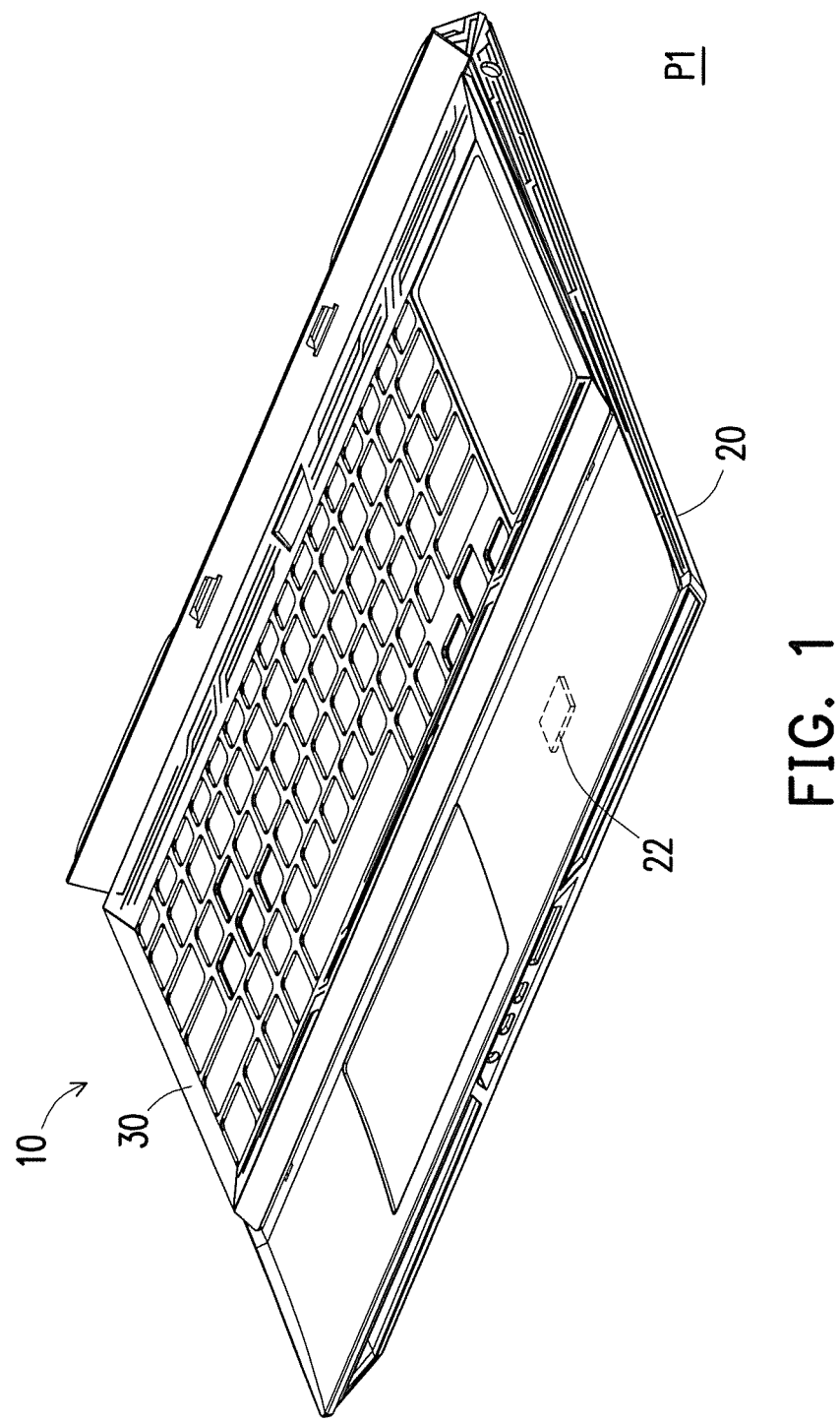
FIG. 1 is a schematic view of a first functional module of an electronic device at a first position according to an embodiment of the present invention.
Figure 2:
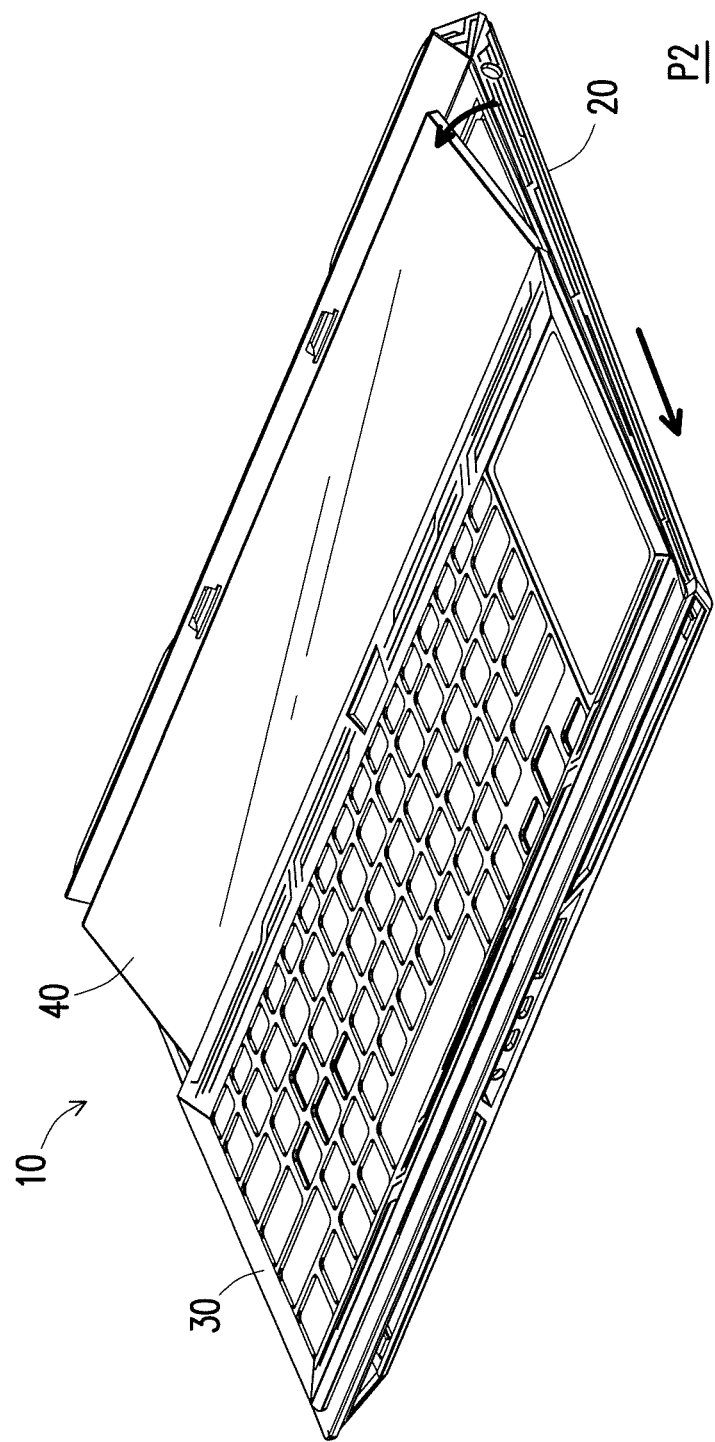
FIG. 2 is a schematic view of the first functional module of the electronic device in FIG. 1 at a second position.

FIG. 1 is a schematic view of a first functional module of an electronic device at a first position according to an embodiment of the present invention. FIG. 2 is a schematic view of the first functional module of the electronic device in FIG. 1 at a second position. Referring to FIG. 1 and FIG. 2, a lower body of a notebook is adopted as an electronic device 10 in the present embodiment, an upper body of the notebook is hidden in FIG. 1 and FIG. 2, the electronic device 10 may actually include the upper body of the notebook, and the upper body may have a screen. Of course, in other embodiments, the type of the electronic device 10 is not limited to this. In other embodiments, the electronic device 10 may be a tablet PC or other devices, which is not limited to this.

As seen from FIG. 1 and FIG. 2, in the present embodiment, the electronic device 10 includes a main body 20, a first functional module 30 and a second functional module 40 (shown in FIG. 2). In the present embodiment, a keyboard module is adopted as the first functional module 30, and a screen is adopted as the second functional module 40. However, in other embodiments, the types of the first functional module 30 and the second functional module 40 are not limited to this. The first functional module 30 may be at least one of a keyboard module, a screen, a loudspeaker, a camera lens, and a receiver, and the second functional module 40 may also be at least one of a keyboard module, a screen, a loudspeaker, a camera lens, and a receiver.

As shown in FIG. 1 and FIG. 2, in the present embodiment, the first functional module 30 is slidably provided on the main body 20 between a first position P1 (as shown in FIG. 1) and a second position P2 (as shown in FIG. 2). When the first functional module 30 is located at the first position P1, the electronic device 10 may be, for example, used as a lower body of a general notebook. At this time, the second functional module 40 is covered by the first functional module 30 without exposure. Because the first functional module 30 and the second functional module 40 are overlapped together, the electronic device 10 may be kept in a small size (area). When the first functional module 30 moves to the second position P2 and the second module 40 is exposed, as shown in FIG. 2, the second functional module 40 may be turned up to obliquely stand on the main body 20, thereby making it convenient for a user to use the first functional module 30 and the second functional module 40.

In the present embodiment, the main body 20 includes a processor 22 (shown in FIG. 1). The processor 22 is, for example, a central processing unit, but the type of the processor 22 is not limited to this. The first functional module 30 and the second functional module 40 are electrically connected to the processor 22, respectively. When the first functional module 30 is located at the first position P1, the second functional module 40 is covered by the first functional module 30 and has not been started up by the processor 22 yet. When the first functional module 30 moves to the second position P2 and the second functional module 40 is exposed and turned up, the processor 22 may start up the second functional module 40. It should be noted that after being turned up, the second functional module 40 may be started up by the processor 22 immediately, or after receiving a startup instruction, the processor 22 starts up the second functional module 40, which is not limited to this.

At this time, because both the first functional module 30 and the second functional module 40 of the electronic device 10 may function, the electronic device 10 has more functions. For example, when the first functional module 30 moves to the second position P2 and the second functional module 40 is turned up, a screen of an upper body (not shown) of the electronic device 10 may serve as a main screen, a screen of the second functional module 40 may serve as an expanded screen to meet a demand that a user needs a larger screen to display more information, and the first functional module 30 may still provide an input function. Of course, in other embodiments, if there is no upper body, the second functional module 40 of the electronic device 10 may also be used as a main screen.

The following introduces the linkage mechanism 100 in the electronic device 10 in the present embodiment, which is used to enable the second functional module 40 to be turned up along with the movement of the first functional module 30.

Figure 3:
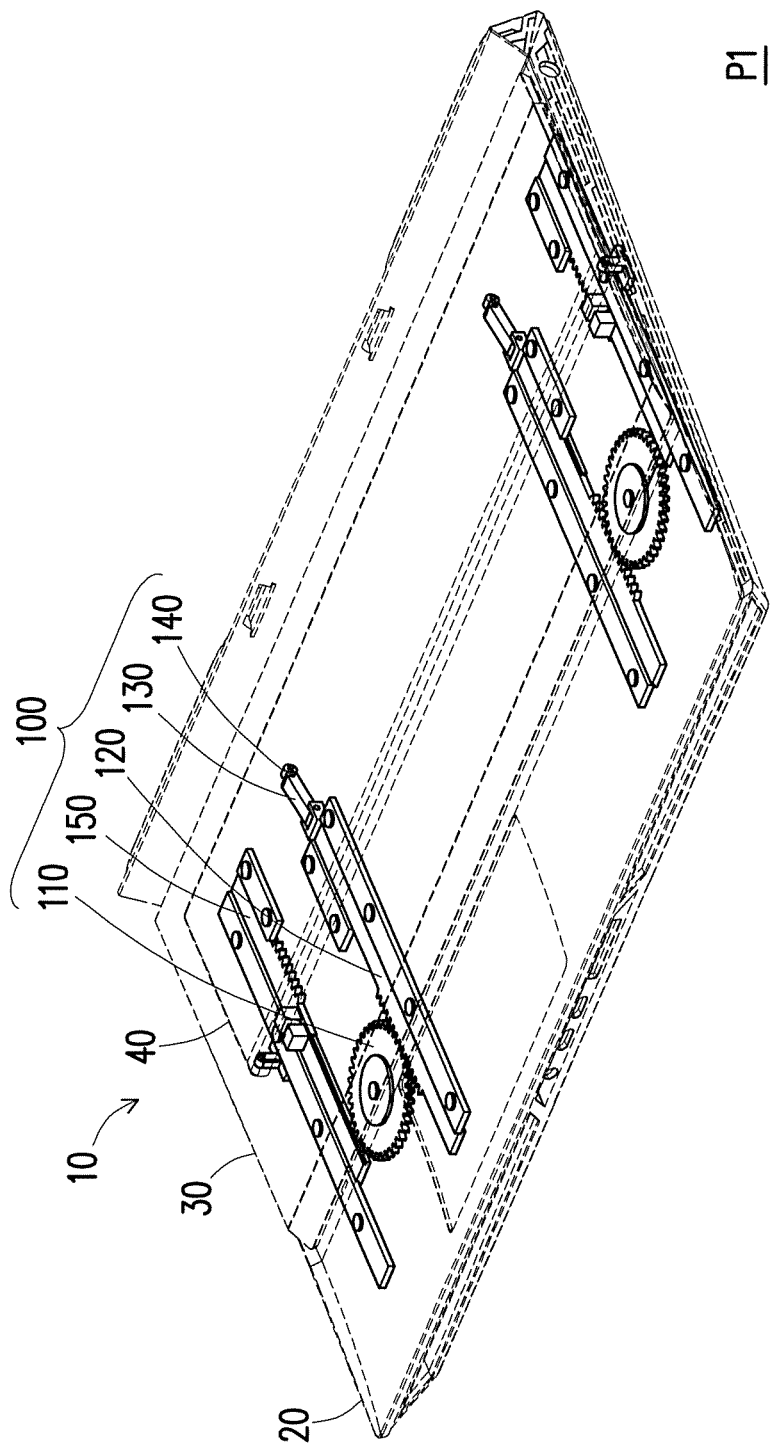
FIG. 3 is a perspective view of the first functional module of the electronic device in FIG. 1 at the first position.
Figure 4:
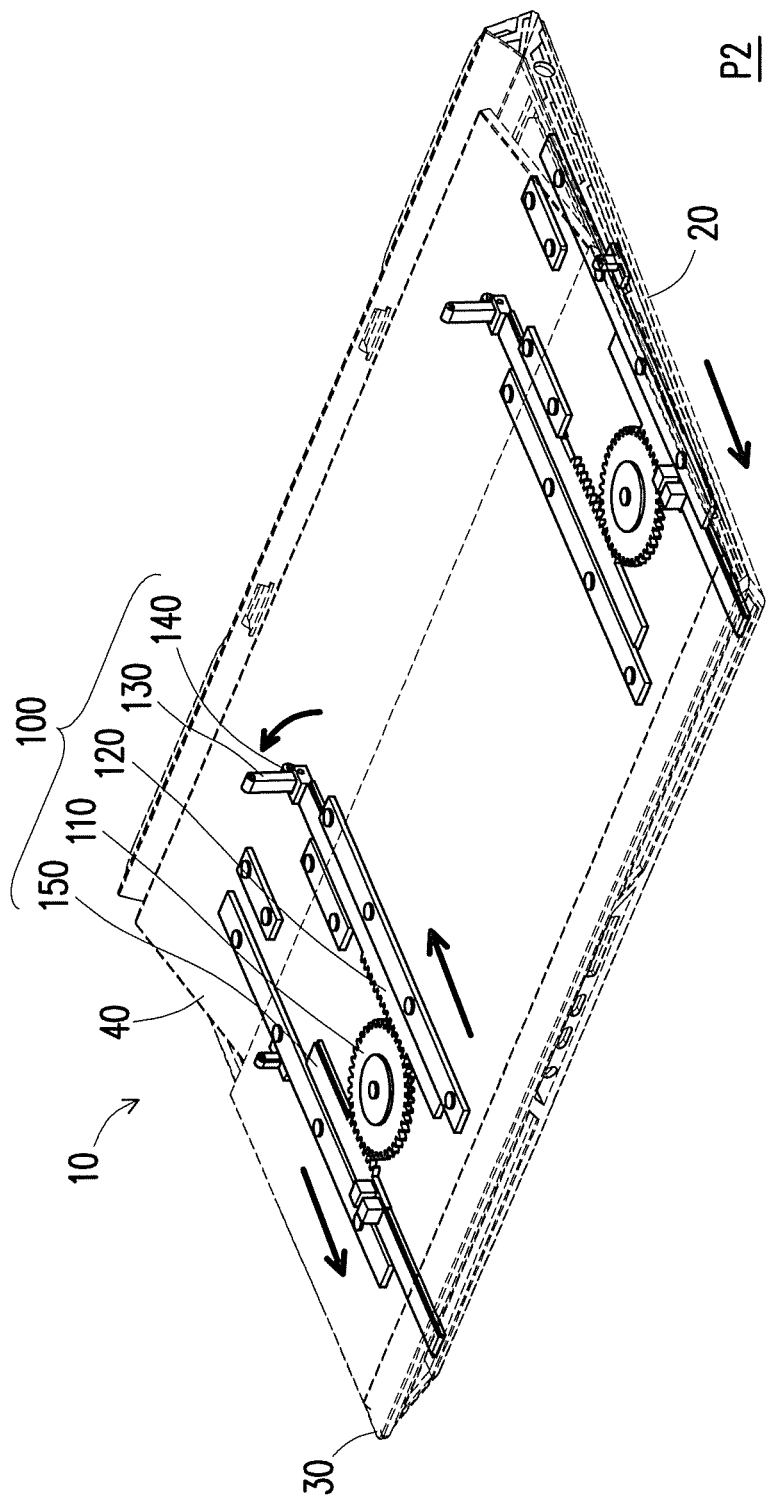
FIG. 4 is a perspective view of the first functional module of the electronic device in FIG. 1 at the second position.

FIG. 3 is a perspective view of the first functional module of the electronic device in FIG. 1 at the first position. FIG. 4 is a perspective view of the first functional module of the electronic device in FIG. 1 at the second position. Referring to FIG. 3 and FIG. 4, the first functional module 30 and the second functional module 40 of the electronic device 10 are specifically represented by dotted lines in FIG. 3 and FIG. 4, so as to clearly show the linkage mechanism 100 therein.

In the present embodiment, the electronic device 10 includes a linkage mechanism 100 provided on the main body 20. The linkage mechanism 100 may be connected to the first functional module 30, and the second functional module 40 may be linked to the linkage mechanism 100 and may be turned up. In particular, in the present embodiment, the linkage mechanism 100 includes a gear 110 provided on the main body 20, a first rack 120 engaged with the gear 110 and movably provided on the main body 20, a support member 130 pivoted to the first rack 120 and located below the second functional module 40, an abutting member 140 fixed to the main body 20 and abutted by the support member 130, and a second rack 150 provided on the first functional module 30 and suitable for being engaged with the gear 110.

In the present embodiment, the first rack 120 and the second rack 150 are located on two opposite sides of the gear 110 respectively. When the first functional module 30 is located at the first position P1 as shown in FIG. 3, the second rack 150 provided on the first functional module 30 has not been engaged with the gear 110 yet, but partial teeth of the gear 110 are located on a movement path of the second rack 150. As seen from FIG. 4, when the first functional module 30 moves from the first position P1 to the second position P2, the second rack 150 is engaged with the gear 110 and drives the gear 110 to rotate, and the rotating gear 110 may drive the first rack 120 to move. Therefore, the first rack 120 may correspondingly move toward a direction opposite to the movement direction of the second rack 150, so that the end, pivoted to the first rack 120, of the support member 130 may gradually approach the abutting member 140 to make the support member 130 gradually stand on the main body 20 so as to support the second functional module 40. In the present embodiment, the abutting member 140 is, for example, a roller pivoted on the main body 20, and the support member 130 may be supported up along the abutting member 140. Of course, the forms of the support member 130 and the abutting member 140 are not limited to this.

Figure 5:
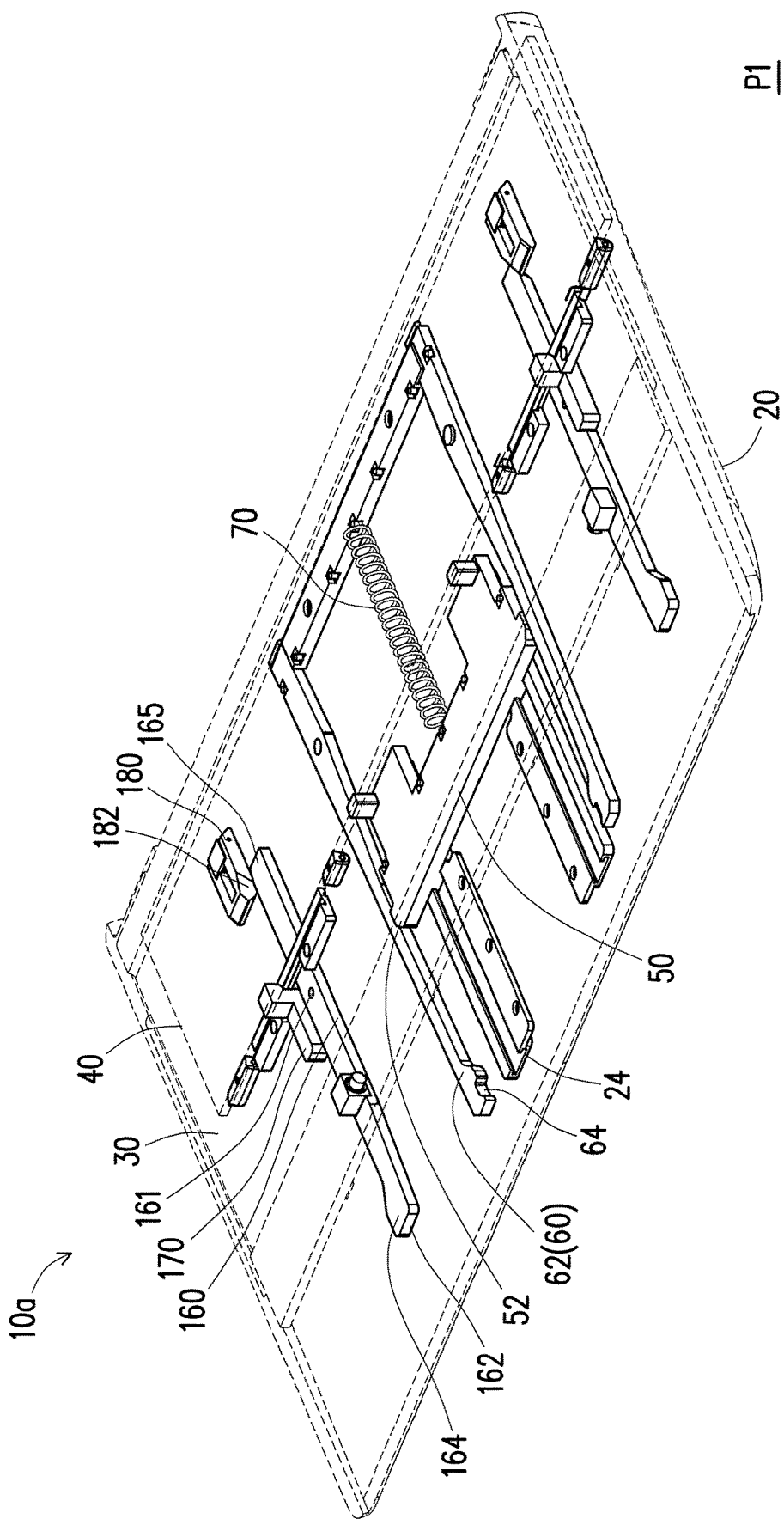
FIG. 5 is a perspective view of a first functional module of an electronic device at a first position according to another embodiment of the present invention.
Figure 6:
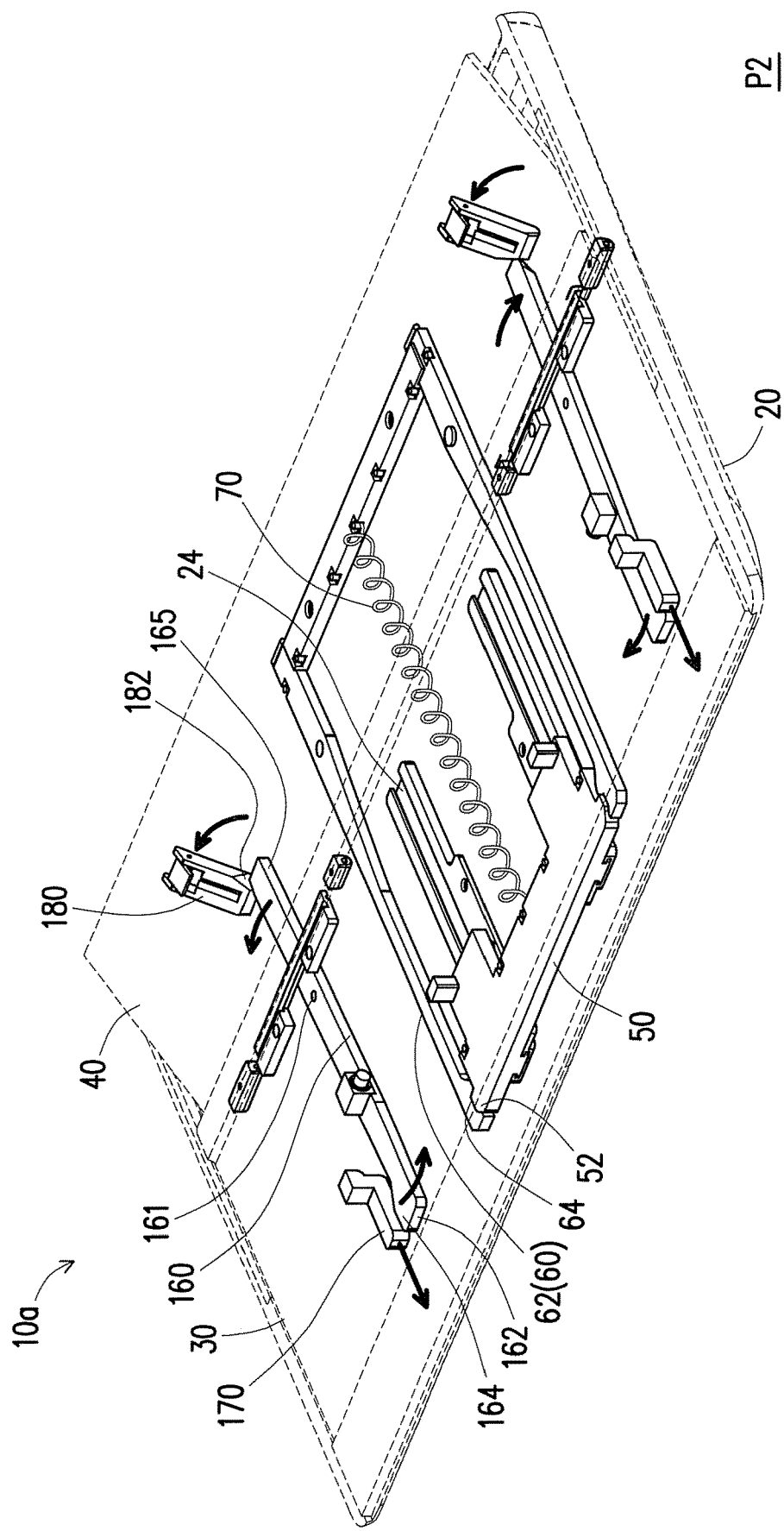
FIG. 6 is a perspective view of the first functional module of the electronic device in FIG. 5 at a second position.

The following provides a linkage mechanism in another form. FIG. 5 is a perspective view of a first functional module of an electronic device at a first position according to another embodiment of the present invention. FIG. 6 is a perspective view of the first functional module of the electronic device in FIG. 5 at a second position. Referring to FIG. 5 and FIG. 6, in the present embodiment, a linkage mechanism of an electronic device 10a includes a rod body 160 rotatably provided in the main body 20 in a horizontal plane, a push block 170 linked to the first functional module 30, and a support member 180 provided on the main body 20 in a turn-up manner and located below the second functional module 40. In the present embodiment, the rod body 160 has a rotation shaft 161, a first end 162, and a second end 165 opposite to the first end 162. The rod body 160 may horizontally rotate with the rotation shaft 161 serving as the axis. The push block 170 and the support member 180 are located on the same side of the rod body 160. The first end 162 includes a protrusion 164 located on a movement path of the push block 170.

As shown in FIG. 6, in the present embodiment, when the first functional module 30 moves from the first position P1 to the second position P2, the push block 170 pushes the protrusion 164 on the first end 162 of the rod body 160 to make the rod body 160 horizontally rotate in the horizontal plane with the rotation shaft 161 serving as the axis. The support member 180 includes an inclined surface 182 facing the second end 165, and the second end 165 of the rod body 160 may press down a part (such as a part where the inclined surface 182 is located) of the support member 180 during rotation to correspondingly lift, like a seesaw, the other part of the support member 180 to drive the second functional module 40 to be turned up. In the present embodiment, a part, facing the support member 180, of the second end 165 of the rod body 160 may also optionally have an inclined surface (not shown), and when pressing the inclined surface 182 of the support member 180, the second end 165 of the rod body 160 may easily move to the upper side of the support member 180. Of course, the forms of the rod body 160 and the support member 180 are not limited to this.

In addition, in the present embodiment, the electronic device 10a may optionally include a movement member 50. The main body 20 includes a track 24. The movement member 50 is fixed to the first functional module 30 and is movably provided on the track 24. The first functional module 30 may move on the main body 20 steadily without deviation by means of the sliding of the movement member 50 along the track 24.

In addition, in the present embodiment, the electronic device 10 may optionally include a stop structure 60, provided on the main body 20. When the first functional module 30 moves to the second position P2, the movement member 50 may be limited by the stop structure 60 to make the first functional module 30 stay at the second position P2. For example, in the present embodiment, the stop structure 60 includes, for example, a cantilever 62. The cantilever 62 is pivoted to the main body 20, a first end of the cantilever 62 has a positioning notch 64, and the movement member 50 has a positioning protrusion 52 corresponding to the positioning notch 64. When the first functional module 30 moves from the first position P1 to the second position P2, the movement member 50 may slightly push the cantilever 62 outward until the positioning protrusion 52 of the movement member 50 is located in the positioning notch 64 of the cantilever 62. At this time, the first functional module 30 may stay at the second position P2, so that the probability of making the first functional module 30 leave the second position P2 due to shaking may be reduced.

In the present embodiment, the electronic device 10 may further optionally include an elastic member 70, provided between the movement member 50 and the stop structure 60. The elastic member 70 is, for example, a spring. Two ends thereof are fixed to the movement member 50 and the stop structure 60 (such as a part, between two cantilevers 62, of the stop structure 60 in FIG. 6) respectively, so as to be suitable for making the first functional module 30 return to the first position P1. In other words, when the first functional module 30 moves from the first position P1 to the second position P2, the elastic member 70 may accumulate elastic potential energy, if a user wants to make the first functional module 30 return, the user pushes the first functional module 30 to make the positioning protrusion 52 of the movement member 50 leave the positioning notch 64 of the cantilever 62, and the elastic member 70 may pull the movement member 50 to make the first functional module 30 return to the first position P1. In other embodiments, a concave-convex relationship of limiting elements between the movement member 50 and the cantilever 62 is not limited to this. Moreover, in other embodiments, the movement member 50, the stop structure 60 and the elastic member 70 may also be applied to an implementation pattern of FIG. 3.

Figure 7:
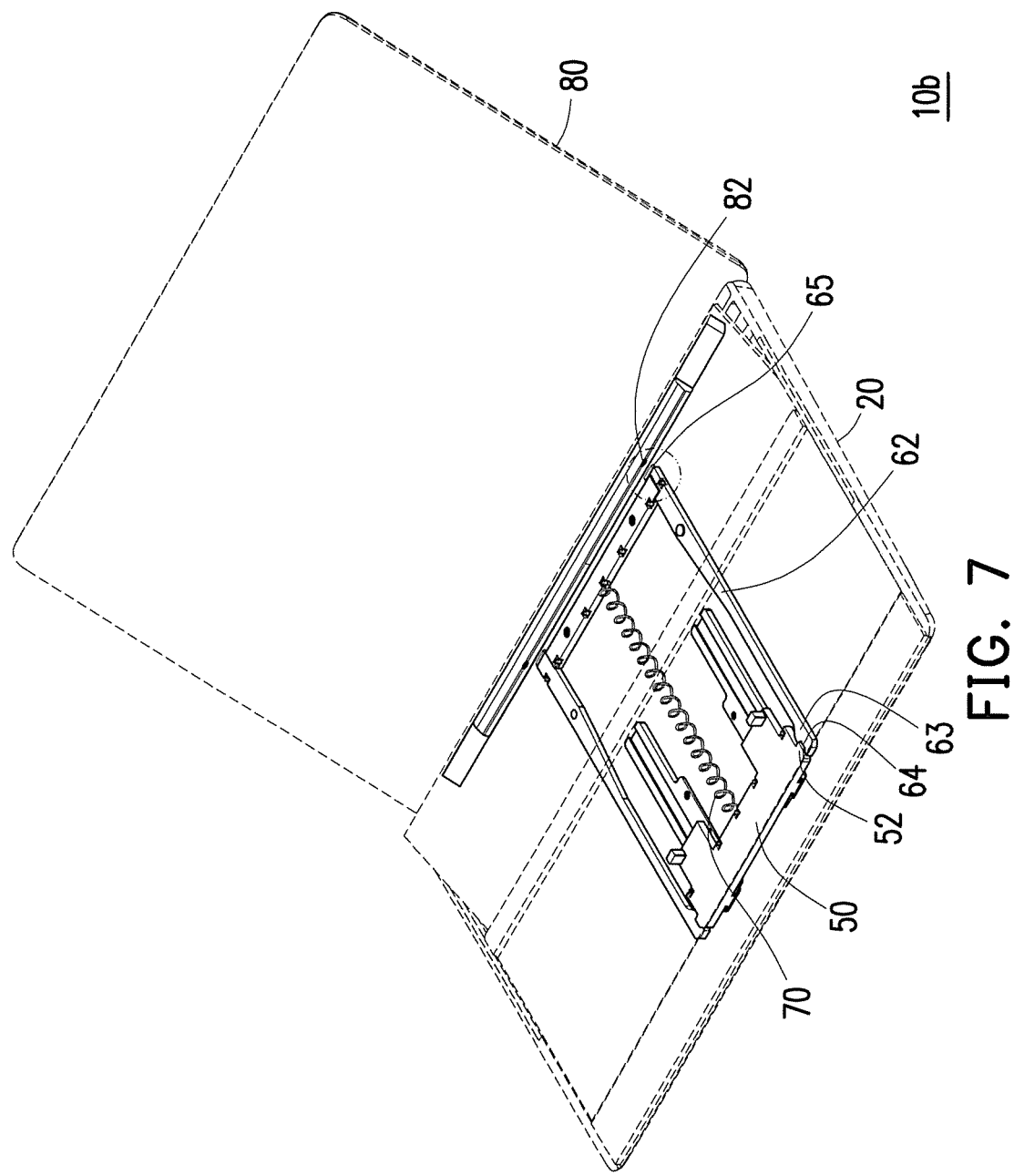
FIG. 7 and FIG. 9 are schematic views showing a process of folding an auxiliary body of an electronic device toward a main body according to an embodiment of the present invention.
Figure 8:
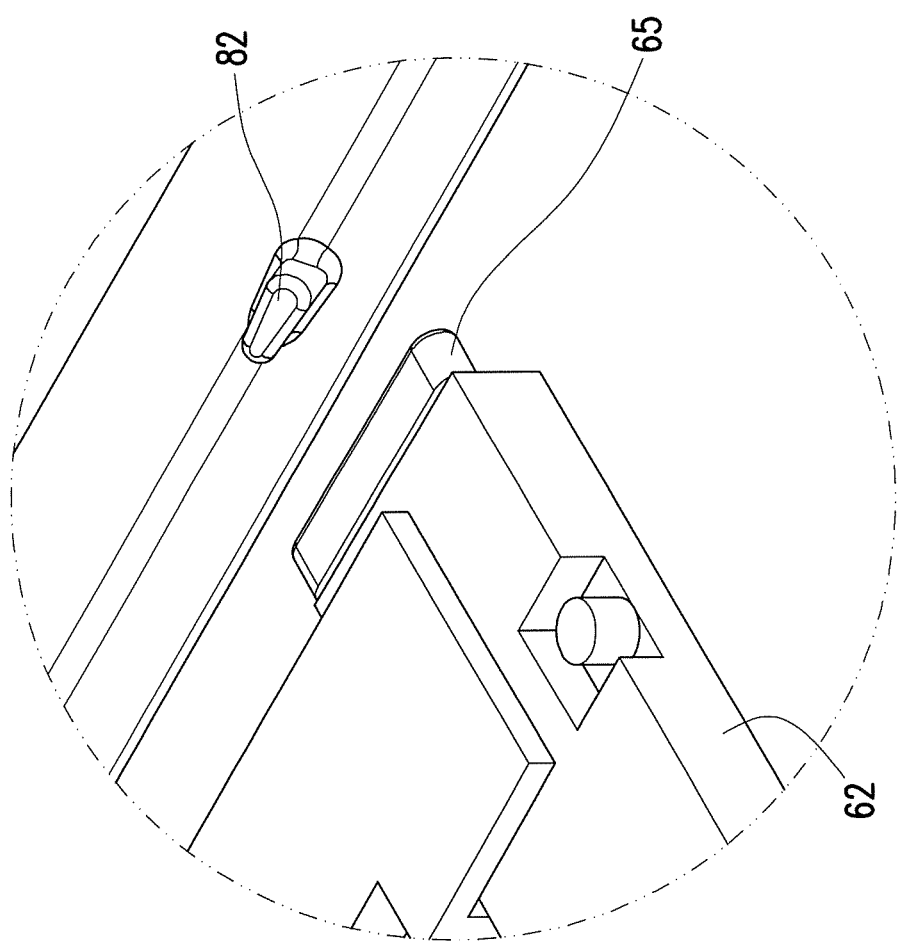
FIG. 8 and FIG. 10 are partial enlarged views of FIG. 7 and FIG. 9 respectively.
Figure 9:
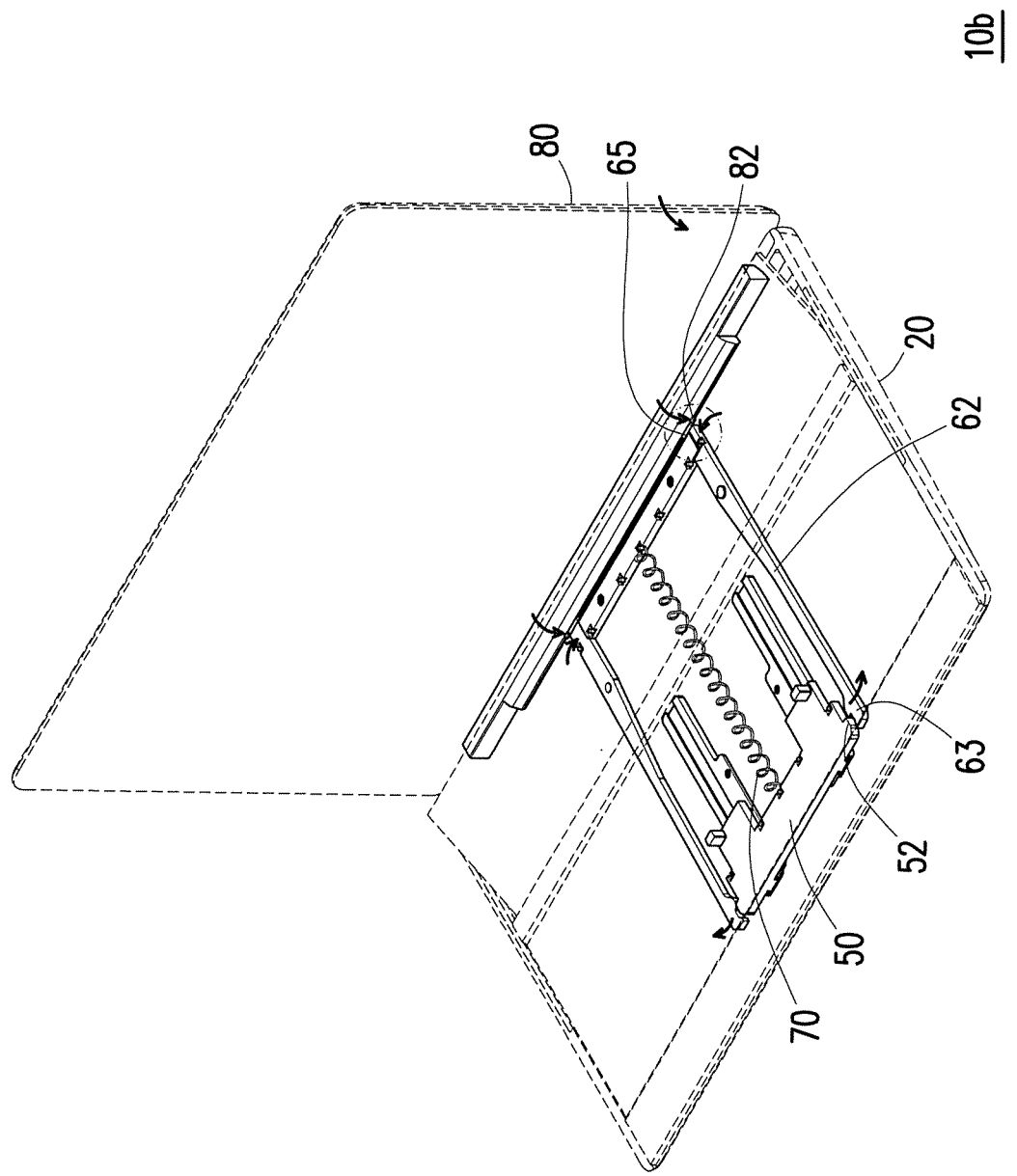
Figure 10:
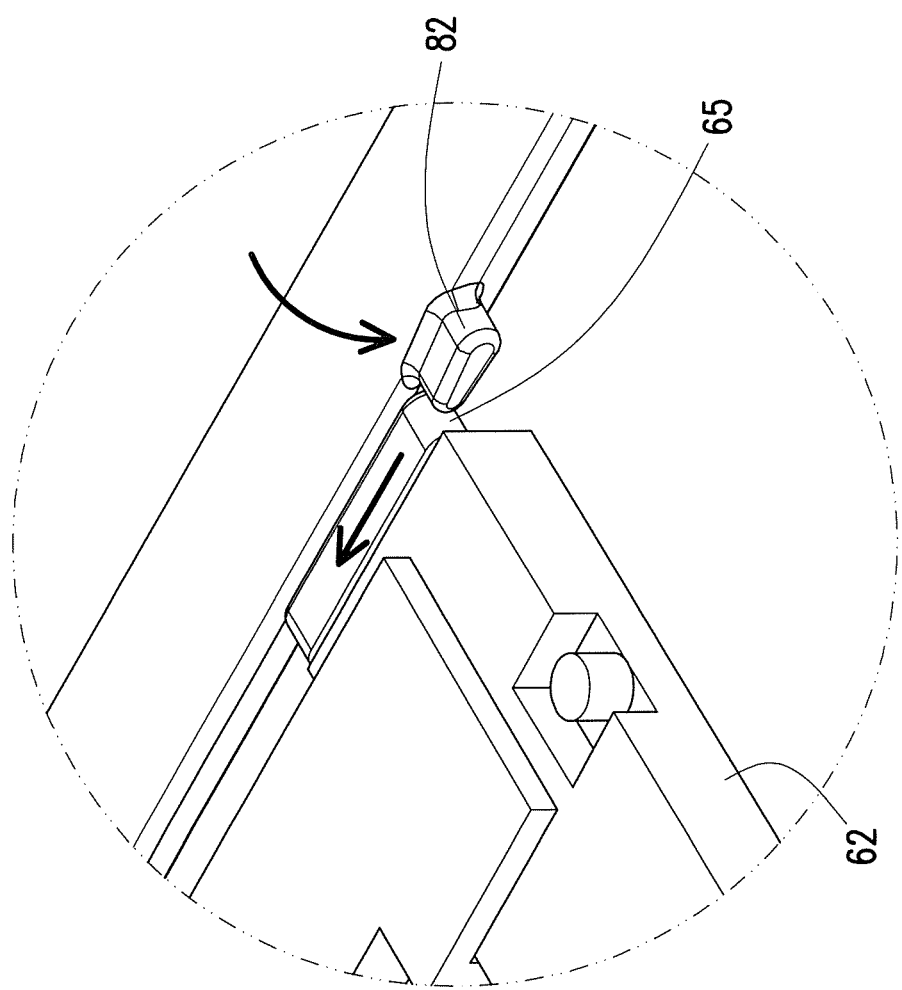

In addition, in other embodiments, a user may not need to actively push the first functional module 30 of the electronic device to make it return. FIG. 7 and FIG. 9 are schematic views showing a process of folding an auxiliary body of an electronic device toward a main body according to an embodiment of the present invention. FIG. 8 and FIG. 10 are partial enlarged views of FIG. 7 and FIG. 9 respectively. It should be noted that in FIG. 7 and FIG. 9, only components on the main body 20, related to active returning to position, are schematically shown, and the rod body 160, the push block 170 and the support member 180 are omitted to avoid too complicated lines.

Referring to FIG. 7 to FIG. 10, in the present embodiment, an electronic device 10b further includes an auxiliary body 80, pivoted to the main body 20 and suitable for being folded toward the main body 20 or unfolded relative to the main body 20. The main body 20 is, for example, a lower body of a notebook. The auxiliary body 80 is, for example, an upper body of the notebook, but the types of the main body 20 and the auxiliary body 80 are not limited to this.

In the present embodiment, the auxiliary body 80 includes a push member 82. A first end 63 of the cantilever 62 has a positioning notch 64, and a second end 65 of the cantilever 62 is located on a motion path of the push member 82. At least one of the push member 82 and the second end 65 of the cantilever 62 includes an inclined surface or a cambered surface. In the present embodiment, the push member 82 has a cambered surface, and the second end 65 of the cantilever 62 also has a cambered surface. In the present embodiment, in a process from a position where the auxiliary body 80 is unfolded relative to the main body 20 to a position where the auxiliary body 80 is folded, as shown in FIG. 10, the push member 82 is turned down along with the auxiliary body 80, and the push member 80 pushes the second end 65 of the cantilever 62 to make the second end 65 of the cantilever 62 rotate inward (for example, the second end 65 of the cantilever 62 on the right of the drawing rotates leftward). As shown in FIG. 9, in this process, the cantilever 62 correspondingly rotates to make the first end 63 of the cantilever 62 rotate outward (for example, the first end 63 of the cantilever 62 on the right of the drawing rotates rightward). In this way, the positioning notch 64 of the cantilever 62 rotates to a position where the positioning protrusion 52 of the movement member 50 is not restricted. The elastic member 70 may pull back the movement member 50.

In other words, when a user folds the auxiliary body 80 toward the main body 20, the positioning notch 64 of the cantilever 62 may remove limiting of the positioning protrusion 52 of the movement member 50, the movement member 50 may return under the pull force of the elastic member 70, the first functional module 30 (shown in FIG. 5) fixed to the movement member 50 may also correspondingly return to the first position P1 (shown in FIG. 5), and the second functional module 40 (shown in FIG. 5) may also be correspondingly turned down to a horizontal position from an inclined position. The user does not need to manually adjust the positions of the first functional module 30 and the second functional module 40, thereby increasing use convenience.

Based on the foregoing, according to the electronic device in the present invention, the first functional module and the second functional module are movably provided on the main body via the linkage mechanism, and the second functional module may be turned over along with the movement of the first functional module. When the first functional module is located at the first position, the second functional module is covered by the first functional module, and the overlapped first and second functional modules may keep a small size of the electronic device. When the first functional module moves to the second position and the second functional module is exposed, the second functional module is driven by the linkage mechanism to be turned up, so that the electronic device can be conveniently used by a user, and expanded functions of the electronic device can be provided.

Although the present invention has been disclosed with the embodiments as above, the embodiments are not intended to limit the present invention. Any person skilled in the art may make some variations and modifications without departing from the spirit and scope of the present invention. Therefore, the protection scope of the present invention should be defined by the appended claims.

What is claimed is:

1. An electronic device, comprising:
   a main body;
   a first functional module, slidably provided on the main body between a first position and a second position;
   a linkage mechanism, provided on the main body and connected to the first functional module, wherein the linkage mechanism comprises a support member; and
   a second functional module, linked to the linkage mechanism and provided on the main body in a turnover manner, the support member located below the second functional module,
   wherein when the first functional module is located at the first position, the second functional module is covered by the first functional module, the second functional module is located underneath the first functional module and between the first functional module and the main body,
   when the first functional module moves to the second position and the second functional module is exposed, the support member gradually stand on the main body so that the second functional module is driven by the support member to be turned up,
   wherein the linkage mechanism comprises a gear provided on the main body, a first rack engaged with the gear and movably provided on the main body, with the support member pivoted to the first rack, an abutting member fixed to the main body and abutted by the support member, and a second rack provided on the first functional module and suitable for being engaged with the gear, and
   when the first functional module moves from the first position to the second position, the second rack drives the gear to rotate, and the first rack correspondingly moves to enable the support member to gradually stand on the main body along the abutting member so as to support the second functional module.

2. The electronic device according to claim 1, wherein when the first functional module moves from the first position to the second position, the end, pivoted to the first rack, of the support member gradually approaches the abutting member to make the support member gradually stand.

3. The electronic device according to claim 1, wherein the linkage mechanism comprises a rod body rotatably provided in the main body, and a push block linked to the first functional module, with the support member provided on the main body in a turn-up manner, the rod body comprises a first end and a second end opposite to the first end, when the first functional module moves from the first position to the second position, the push block pushes the first end of the rod body to make the rod body rotate, and the second end of the rod body presses a part of the support member to correspondingly lift the other part of the support member to drive the second functional module to be turned up.

4. The electronic device according to claim 3, wherein the push block and the support member are located on the same side of the rod body, the first end comprises a protrusion located on a movement path of the push block, the support member comprises an inclined surface facing the second end, and the inclined surface is a part, pressed by the second end of the rod body, of the support member.

5. The electronic device according to claim 1, further comprising:

a movement member, the main body comprising a track, and the movement member being fixed to the first functional module and movably provided on the track.

6. The electronic device according to claim 5, further comprising:

a stop structure, provided on the main body, wherein when the first functional module moves to the second position, the movement member is limited by the stop structure to make the first functional module stay at the second position.

7. The electronic device according to claim 6, wherein the stop structure comprises a cantilever, the cantilever is pivoted to the main body, a first end of the cantilever comprises a positioning notch, the movement member comprises a positioning protrusion corresponding to the positioning notch, and when the first functional module is located at the second position, the positioning protrusion is located in the positioning notch.

8. The electronic device according to claim 7, further comprising:

an auxiliary body, pivoted to the main body and suitable for being folded toward the main body or unfolded relative to the main body, the auxiliary body comprising a push member, and a second end of the cantilever being located on a motion path of the push member, wherein when the first functional module is located at the second position, in a process from a position where the auxiliary body is unfolded relative to the main body to a position where the auxiliary body is folded, the push member pushes the second end of the cantilever, and the cantilever correspondingly rotates to make the positioning notch of the cantilever not restrict the positioning protrusion of the movement member.

9. The electronic device according to claim 8, wherein when the push member pushes the second end of the cantilever, the motion direction of the push member is different from the motion direction of the second end of the cantilever, and at least one of the push member and the second end of the cantilever comprises an inclined surface or a cambered surface.

10. The electronic device according to claim 6, further comprising:

an elastic member, provided between the movement member and the stop structure and suitable for making the first functional module return to the first position.

11. The electronic device according to claim 1, wherein the first functional module comprises a keyboard module, and the second functional module comprises at least one of a screen, a loudspeaker, a camera lens, and a receiver.

12. The electronic device according to claim 1, wherein the main body comprises a processor, the first functional module and the second functional module are electrically connected to the processor, respectively, and when the first functional module moves to the second position, the processor starts up the second functional module.

* * * * *